US011942460B2

(12) United States Patent
Ng et al.

(10) Patent No.: US 11,942,460 B2
(45) Date of Patent: Mar. 26, 2024

(54) SYSTEMS AND METHODS FOR REDUCING THE SIZE OF A SEMICONDUCTOR ASSEMBLY

(71) Applicant: Micron Technology, Inc., Boise, ID (US)

(72) Inventors: Hong Wan Ng, Singapore (SG); Kelvin Tan Aik Boo, Singapore (SG); Chin Hui Chong, Singapore (SG); Hem P. Takiar, Fremont, CA (US); Seng Kim Ye, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/137,085

(22) Filed: Dec. 29, 2020

(65) Prior Publication Data

US 2022/0208744 A1 Jun. 30, 2022

(51) Int. Cl.
*H01L 25/065* (2023.01)
*H01L 21/56* (2006.01)
*H01L 23/31* (2006.01)
*H01L 25/00* (2006.01)
(Continued)

(52) U.S. Cl.
CPC ............ *H01L 25/16* (2013.01); *H01L 21/563* (2013.01); *H01L 23/3192* (2013.01); *H01L 25/0657* (2013.01); *H01L 25/50* (2013.01); *H01L 28/40* (2013.01)

(58) Field of Classification Search
CPC ....... H01L 25/0657; H01L 2225/06503; H01L 2225/06562; H01L 2225/06555; H01L 28/40; H01L 2924/12; H01L 2924/1205; H01L 2924/1901; H01L 2924/19041; H01L 2924/3512; H05K 1/181; H05K 2201/10568; H05K 2201/2036
See application file for complete search history.

(56) References Cited

U.S. PATENT DOCUMENTS

| | | | |
|---|---|---|---|
| 11,386,004 B2 * | 7/2022 | Keeth | H01L 25/18 |
| 11,450,645 B2 * | 9/2022 | Bhushan | H01L 24/85 |
| 11,569,193 B2 * | 1/2023 | Kang | H01L 24/48 |

(Continued)

FOREIGN PATENT DOCUMENTS

| | | |
|---|---|---|
| TW | 201603211 A | 1/2016 |
| TW | 201916278 A | 4/2019 |

*Primary Examiner* — Marcos D. Pizarro
*Assistant Examiner* — William H Anderson
(74) *Attorney, Agent, or Firm* — Perkins Coie LLP

(57) ABSTRACT

Semiconductor devices and associated systems and methods are disclosed herein. In some embodiments, the semiconductor device is an assembly that includes a package substrate having a front side and a backside opposite the front side. A controller die with a first longitudinal footprint can be attached to the front side of the package substrate. A passive electrical component is also attached to the front side of the package substrate. A stack of semiconductor dies can be attached to the controller die and the passive electrical component. The stack of semiconductor dies has a second longitudinal footprint greater than the first longitudinal footprint in at least one dimension. The controller die and the passive electrical component are positioned at least partially within the second longitudinal footprint, thereby at least partially supporting the stack of semiconductor dies.

18 Claims, 7 Drawing Sheets

(51) Int. Cl.
*H01L 25/16* (2023.01)
*H01L 49/02* (2006.01)

(56) References Cited

U.S. PATENT DOCUMENTS

| | | | | |
|---|---|---|---|---|
| 2009/0267220 | A1* | 10/2009 | Kuhlman | H05K 1/181 |
| | | | | 438/118 |
| 2013/0049228 | A1* | 2/2013 | Nam | H01L 25/0657 |
| | | | | 257/777 |
| 2018/0130781 | A1* | 5/2018 | Kang | H01L 24/48 |
| 2019/0333907 | A1* | 10/2019 | Lee | H01L 21/6835 |
| 2020/0227393 | A1* | 7/2020 | Kim | H01L 24/32 |
| 2021/0249382 | A1* | 8/2021 | Jeong | H01L 24/32 |

* cited by examiner

SYSTEMS AND METHODS FOR REDUCING THE SIZE OF A SEMICONDUCTOR ASSEMBLY

TECHNICAL FIELD

The present disclosure generally relates to semiconductor devices. In particular, the present technology relates to semiconductor die stack assemblies having a reduced overall size, and associated systems and methods.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies and yet increase the capacity and/or speed of the resulting semiconductor assemblies. To meet these demands, semiconductor die manufacturers often stack multiple semiconductor dies vertically on top of each other to increase the capacity or performance of a microelectronic device within the limited area on a circuit board or other element to which the semiconductor dies and/or assemblies are mounted.

To further meet these demands, semiconductor die manufacturers have continually reduced the thickness of semiconductor dies to reduce the overall height of the stack of semiconductor dies. However, electrical components other than the semiconductor dies in the semiconductor assembly occupy a significant volume and can limit the ability to reduce the volume of the semiconductor assembly. For example, some semiconductor die stacks can be shorter than the other electrical components in the semiconductor assembly such that further reductions in volume (e.g., package height) cannot be achieved by reducing the thickness of the semiconductor die alone.

BRIEF DESCRIPTION OF THE DRAWINGS

Many aspects of the present technology can be better understood with reference to the following drawings. The components in the drawings are not necessarily drawn to scale. Instead, emphasis is placed on clearly illustrating the principles of the present technology.

DETAILED DESCRIPTION

Figure 1:
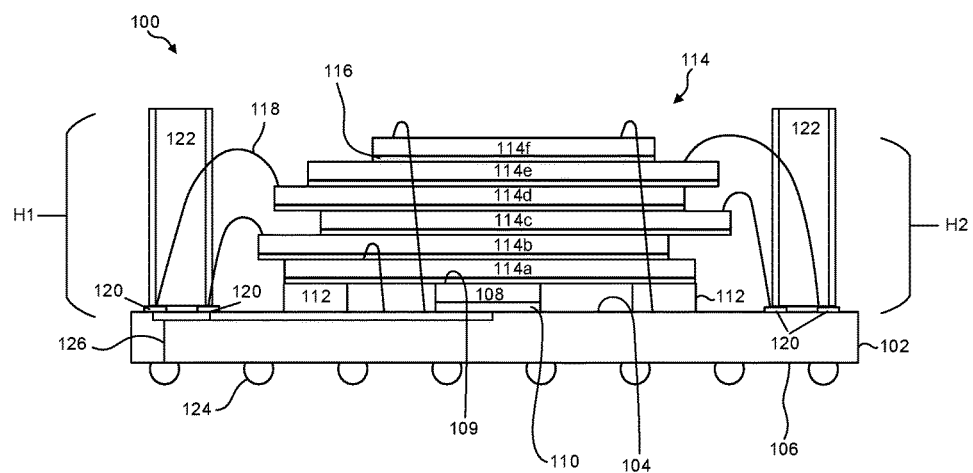
FIG. 1 is a cross-sectional view of a semiconductor assembly limited in height reduction by passive electrical components.

Semiconductor device assemblies having a reduced overall volume (e.g., package height) and associated systems and methods are disclosed herein. In some embodiments, the semiconductor device assembly includes a package substrate having a front side and a backside, a controller die connected to the front side of the package substrate, and a stack of semiconductor dies on the controller die. The controller die has a first longitudinal footprint, and the stack of semiconductor dies has a second longitudinal footprint greater than the first longitudinal footprint in at least one dimension. The semiconductor device also includes a passive electrical component on the front side of the package substrate (e.g., a passive capacitor) and positioned at least partially within the second longitudinal footprint. The passive electrical component and the controller die support the stack of semiconductor dies.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. Further, although discussed primarily as passive capacitors herein, other passive electrical components may limit the reductions in height of the semiconductor devices disclosed below. Accordingly, the solutions discussed herein with respect to the passive capacitors may also be applied to various other passive components (e.g., resistors, inductors, transformers, or other electrical components) in a semiconductor device.

FIG. 1A is a cross sectional view, and FIG. 1B is a top plan view, of a semiconductor assembly 100 (the "assembly 100") configured without the present technology. With reference to FIG. 1A, the assembly 100 includes a package substrate 102 having a front side 104 and a back side 106 opposite the front side 104, a first semiconductor die 108 (sometimes referred to as the "first die 108") attached to a central portion of the front side 104 by a die-attach film 110, and spacers 112 attached to the front side 104 in a pattern around the first die 108. The package substrate 102 can be an interposer substrate, such as a printed circuit board, dielectric spacer, semiconductor die, or another suitable substrate. The spacers 112 can be silicon or ceramic support columns. The first die 108 and/or the spacers 112 can be attached to the package substrate 102 using die-attach materials such as die-attach films 110, epoxies, tapes, pastes, or other suitable materials.

As further illustrated in FIG. 1A, the assembly 100 includes a stack of second semiconductor dies 114a-f (referred collectively as "second dies 114" or "die stack 114") attached to an upper surface 109 of the first die 108 and an upper surface 113 of the spacers 112. In the illustrated embodiment, each second die 214 is attached to the semiconductor die beneath it by a die-attach film 116. In other embodiments, each second die 114 can be attached using various other die-attach materials (e.g., other attach films, epoxies, tapes, pastes, or other suitable materials). Further, each second die 114 is electrically connected to the package substrate 102 through a connector 118 (e.g., wire bonds) bonded to a bond site 120 (e.g., bond pads) at the front side 104 of the package substrate 102. The assembly 100 also includes capacitors 122 (e.g., passive capacitors) attached to a peripheral portion of the front side 104 and electrically connected to one or more of the bond sites 120 at the front side 104.

In some embodiments, the package substrate 102 can also include various redistribution structures 126. In various embodiments, the redistribution structures 126 can connect the bond sites 120 to the first die 108 and/or one or more interconnection elements 124 on the back side 106 of the package substrate 102.

The first semiconductor die 108 and the second semiconductor dies in the assembly 100 can each have integrated circuits or components, data storage elements, processing components, and/or other features manufactured on semiconductor substrates. For example, the first and second semiconductor dies 108, 114 can include integrated memory circuitry and/or logic circuitry, which can include various types of semiconductor components and functional features, such as dynamic random-access memory (DRAM), static random-access memory (SRAM), flash memory, other forms of integrated circuit memory, processing circuits, imaging components, and/or other semiconductor features. In some embodiments, the first and second semiconductor dies 108, 114 can be identical (e.g., memory dies manufactured to have the same design and specifications), but in other embodiments the first semiconductor dies 108 can be different than the second semiconductor dies 114 (e.g., different types of memory dies or a combination of controller, logic, and/or memory dies). In one embodiment, for example, the first semiconductor die 108 can be a controller die, while the second semiconductor dies 114 are memory and/or other logic dies under the control of the first die 108.

As further illustrated in FIG. 1, the capacitors 122 have a first height H1 while the combination of the first die 108 and the stack of second semiconductor dies 114 has a second height H2 less than the first height H1. As a result, no matter how thin the second semiconductor dies 114 are made, the capacitors 122 define the height of the assembly 100. The capacitors 122 are accordingly the limiting factor in scaling down the overall package height of the assembly 100.

Figure 2A:
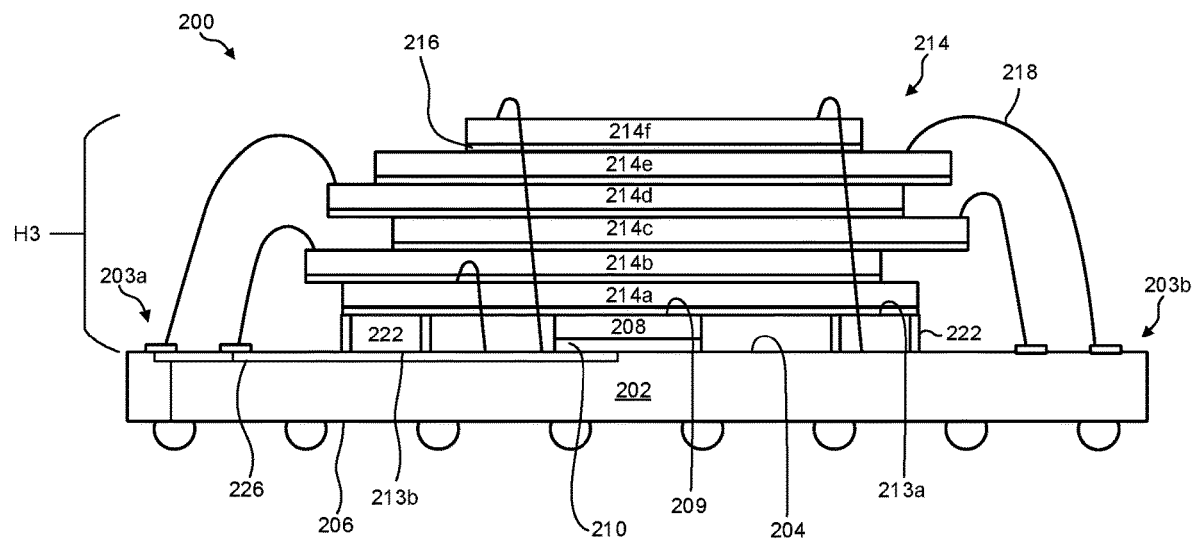
FIG. 2A is a cross-sectional view of an assembly having passive electrical components configured in accordance with some embodiments of the present technology.
Figure 2B:
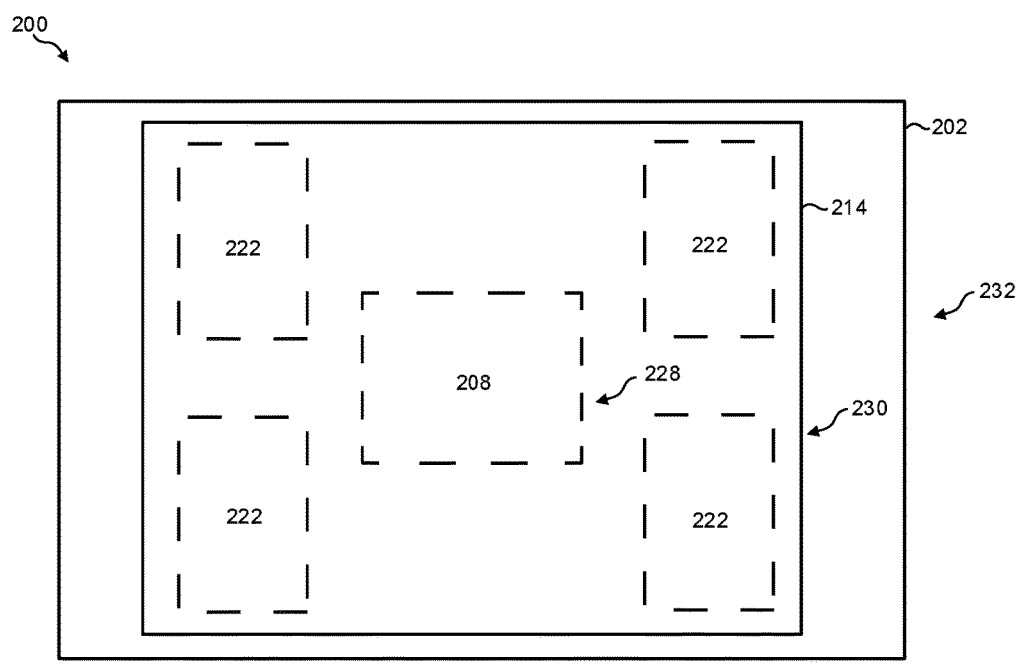
FIG. 2B is a top plan view of the semiconductor assembly of FIG. 2A configured in accordance with some embodiments of the present technology.

FIG. 2A is a cross-sectional sideview, and FIG. 2B is a top plan view, of a semiconductor assembly 200 (the "assembly 200") configured in accordance with some embodiments of the present technology. The assembly 200 includes a package substrate 202 having a front side 204 and a back side 206. A first die 208 is attached to a central portion of the front side 204, and a stack of second dies 214a-f (referred to collectively as "second dies 214" or "die stack 214") is attached to the first die 208. The second semiconductor dies 214 are electrically connected to the package substrate 202 through connectors 218 and bond sites 220.

The assembly 200 also includes one or more capacitors 222 sized to fit underneath the die stack 214. In the illustrated embodiment, the assembly 200 includes two or more low-profile capacitors 222 positioned at least partially underneath the bottom of the die stack 214. At least one of the capacitors 222 is positioned between the first die 208 and a first edge 203a of the substrate 202, and at least one of the capacitors 222 is positioned between the first die 208 and a second edge 203b of the substrate 202. That is, while the first die 208 is positioned in a central portion of the substrate, the capacitors 222 are positioned in a second portion circumferentially surrounding the central portion.

In some embodiments, the assembly 200 can include four capacitors 222 but the assembly can have a different number of capacitors 222. The number of capacitors 222 is based on the total capacitance requirement of the assembly 200. Accordingly, in various embodiments, the assembly 200 can include various other numbers of capacitors 222 (e.g., one capacitor, two capacitors, eight capacitors, or any suitable number of capacitors). Further, in some embodiments, the capacitors 222 can be selected based on additional parameters such as operating temperature range, capacitance tolerance (e.g., variation in capacitance), size tolerance (variation in size such as height, length, and/or width), voltage rating, and/or other factors.

As illustrated in FIG. 2A, the capacitors 222 have a height H3. In some embodiments, the height H3 can be generally equal to the height of the combination of the first die 208 and a die-attach film 210 so that the upper surface 213a of the capacitors 222 is generally parallel with the upper surface 209 of the first die 208 when a lower surface 213b of the capacitors 222 is attached to the substrate 202. In these embodiments, the capacitors 222 are sized to at least partially support the weight of the stack of second dies 214. Further, in these embodiments, the height tolerance of the capacitors 222 can be a substantial factor in the selection of the capacitors 222 because too much variation in size can cause the stack of second dies 214 to be unstable, thereby undermining the structural integrity of the assembly 200.

Since the capacitors 222 are placed underneath the die stack 214, the overall height of the assembly 200 can be generally equal to the combined height H2 of the die stack 214 and the first die 208. As a result, the die thickness of each semiconductor die 214 becomes a significant factor in the overall package height of the assembly 200 insert of the capacitor height.

Further, as illustrated with reference to FIG. 2B, the capacitors 222 may be wider and/or longer than the tall capacitors 122 shown in FIG. 1 so that the capacitors 222 can fit under the die stack 214 and provide the total capacitance required for the assembly 200. Accordingly, an overall footprint 232 of the assembly 200 can be reduced compared to the overall footprint 132 of the assembly 100 of FIG. 1. In the embodiment illustrated in FIG. 2B, the capacitors 222 are placed completely within the footprint 230. In some embodiments, this placement can allow the overall footprint 232 to be generally equal to the footprint 230 of the die stack 214. In other embodiments, the capacitors 222 can also be partially outside of the footprint 230. That is, locating the capacitors underneath the second dies 214 allows the assembly 200 to shrink in both overall height and overall footprint 232. The volume of the assembly 200 can accordingly be significantly reduced, and/or the capacity and/or speed of the resulting electronic devices can be increased, as discussed in more detail below with respect to FIGS. 7 and 8.

FIGS. 3-8 illustrate various aspects of the assembly configured in accordance with embodiments of the present technology. In each of the illustrated embodiments, the assembly 200 includes the package substrate 202 having the front side 204 and the back side 206. The first die 208 is attached to a central portion of the front side 204, one or more capacitors 222 surround the first die 208, and the second dies 214 are attached to the top of the first die 108 and the capacitors 222

Figure 3:
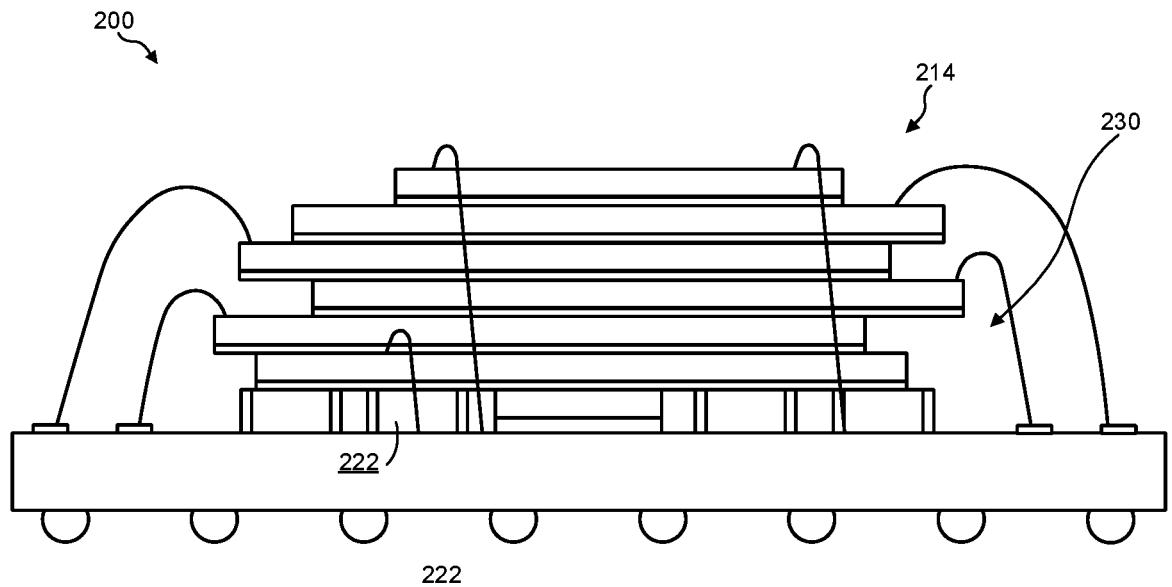
FIG. 3 is a cross-sectional sideview of the assembly of FIG. 2A in accordance with embodiments of the present technology.

FIG. 3 is a cross-sectional sideview of the assembly 200 of FIG. 2A in accordance with some embodiments of the present technology. The assembly 200 includes a larger number of capacitors 222 at least partially within the footprint 230 of the die stack 214. In some embodiments, additional capacitors 222 can be used to provide the desired total capacitance requirement of the assembly 200. In some embodiments, additional capacitors 222 can be used to further support the stack of die stack 214. As a result, the additional capacitors 222 can increase the stability of the die stack 214 and thereby improve the durability of the assembly 200.

Figure 4:
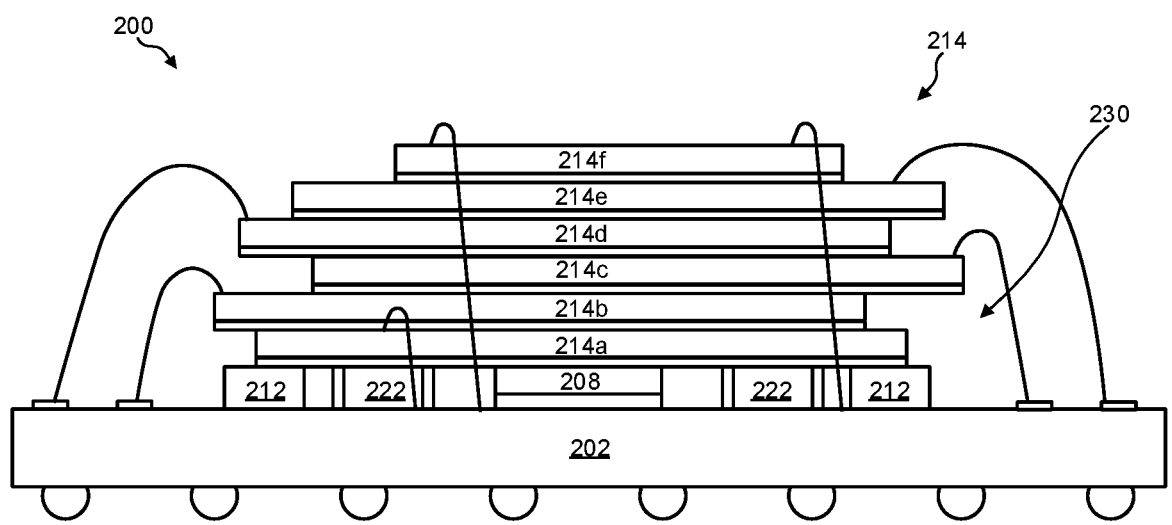
FIG. 4 is a cross-sectional sideview of the assembly of FIG. 2A in accordance with embodiments of the present technology.

FIG. 4 is a cross-sectional sideview of the assembly 200 of FIG. 2A in accordance with some embodiments of the present technology. In the illustrated embodiment, the assembly 200 also includes spacers 212 positioned at least partially within the footprint 230 of the die stack 214. The spacers 212 can be used in combination with the capacitors 222 to support the die stack 214 within the footprint 230 to increase the stability of the die stack 214 and thereby improve the durability of the assembly 200. In some embodiments, the spacers 212 can be used to support the die stack 214 in place of the capacitors 222, for example when the height of the capacitors 222 is less than the height of the first die 208.

As further illustrated in FIG. 4, the spacers 212 can be positioned in a third portion of the substrate 202 circumferentially outside of the second portion of the substrate 202 in which the capacitors 222 are positioned. In various other embodiments, the spacers 212 and capacitors 222 can be organized in various other ways. For example, the capacitors 222 can be positioned circumferentially outside of the spacers 212 relative to the first die 208; the capacitors 222 and the spacers 212 can be randomly organized circumferentially outwards relative to the first die 208; or the capacitors 222 and the spacers 212 can be arranged equidistant from the first die 208.

Figure 5:
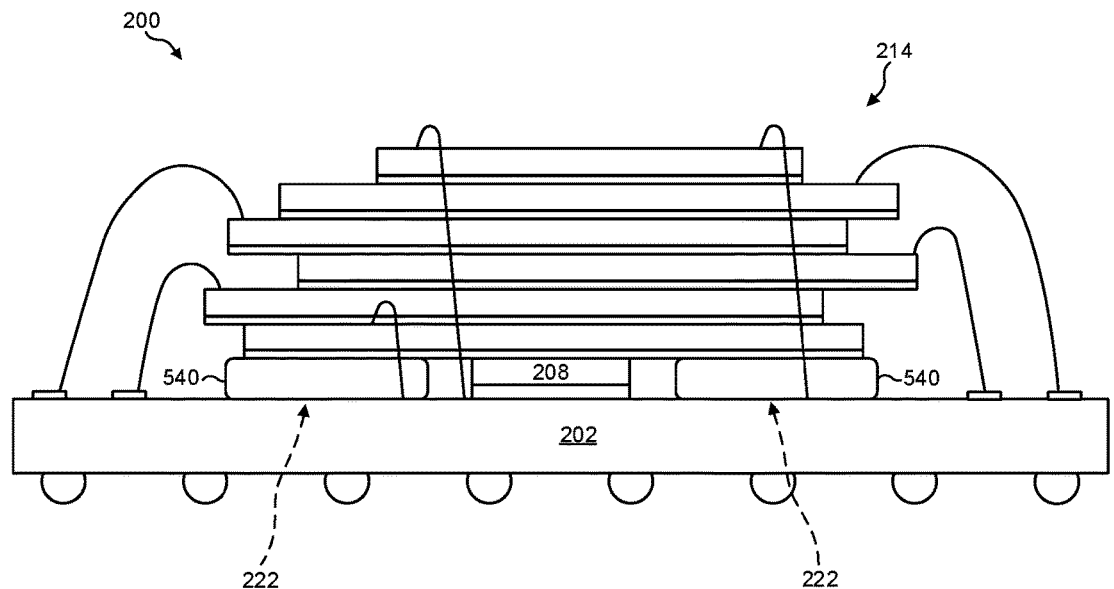
FIG. 5 is a cross-sectional sideview of the assembly of FIG. 2A in accordance with embodiments of the present technology.

FIG. 5 is a cross-sectional sideview of the assembly 200 of FIG. 2A in accordance with some embodiments of the present technology. In the illustrated embodiment, the assembly 200 also includes an encapsulant material 540 at least partially encasing each of the capacitors 222. The encapsulant material 540 can provide mechanical support to the stack of second dies 214 and/or insulation and/or mechanical protection to the capacitors 222. For example, the encapsulant material 540 can be a polyester, a cellulosic material, a thermoset material, or other suitable material.

The encapsulant material 540 can disperse the weight of the die stack 214 and thereby increase the lifespan of the elements of the assembly 200 bearing the weight. The encapsulant material 540 can also stabilize the stack of second dies 214, thereby increasing the lifespan of the assembly 200. In some embodiments, the encapsulant material 540 can be more accurately tailored to the height of the first die 208 to account for differences in height among capacitors 222 as passive devices may not be manufactured to precise dimensions. For example, the encapsulant material 540 can be used to accurately match the height of the first die 208.

Figure 6:
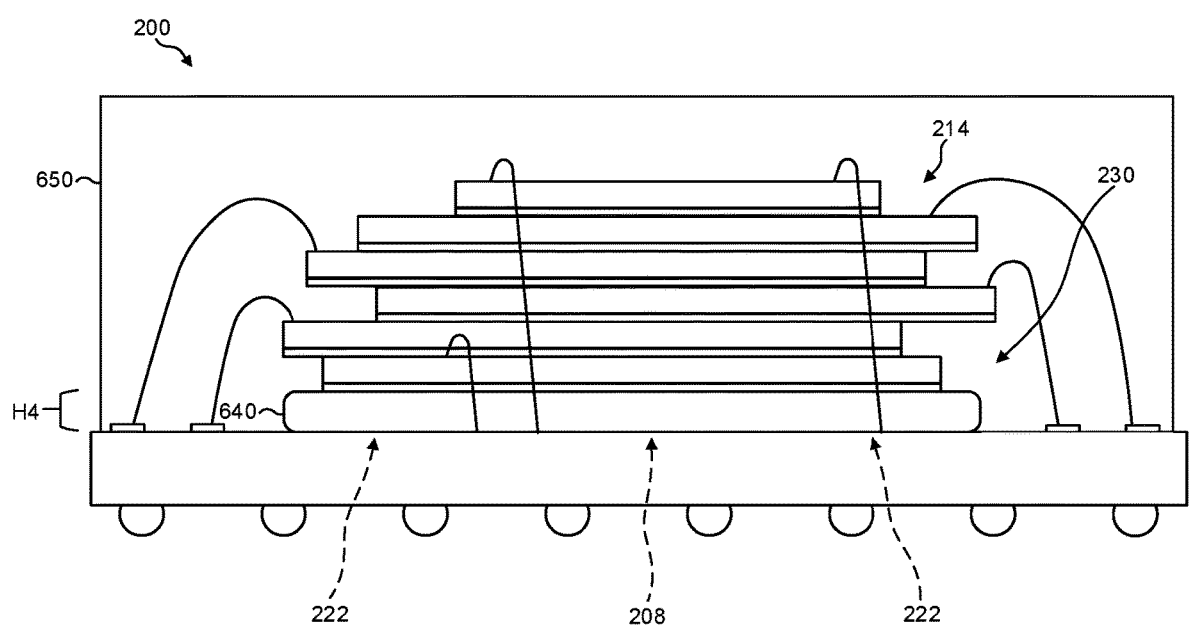
FIG. 6 is a cross-sectional sideview of the assembly of FIG. 2A in accordance with embodiments of the present technology.

FIG. 6 is a cross-sectional sideview of the assembly 200 of FIG. 2A in accordance with embodiments of the present technology in which the assembly 200 includes a first encapsulant material 640 encasing both the capacitors 222 and the first die 208 and a second encapsulant material 650 encasing the other semiconductor elements in the assembly 200. In some embodiments, the first encapsulant material 640 can have a footprint 642 generally equal to the footprint 230 of the die stack 214. In some embodiments, the first encapsulant material 640 supports and stabilizes the die stack 214 over a greater area to increase the lifespan of the assembly 200. The first encapsulant material 640 can have a height H4 larger than the height of the first die 208 and the capacitors 222 such that an upper surface 644 of the spacer material can be planarized to provide a very planar surface to which the stack of second dies 214 is attached. In some embodiments, the first encapsulant material 640 has multiple heights. For example, one portion of the first encapsulant material 640 can have a first height generally corresponding to the height of the capacitors 222 and another portion of the encapsulated material 640 can have a second height different than the first height generally corresponding to the height of the first die 208. The variation in height can be used, for example, to expose the upper surface 209 (FIG. 2A) of the first die 208 for electrical connection.

The first encapsulant material 640 can also protect and/or electrically isolate the first die 208 to further extend the lifespan of the assembly 200. The second encapsulant material 650 can further protect and/or insulate any exposed portions of the capacitors 222.

Figure 7:
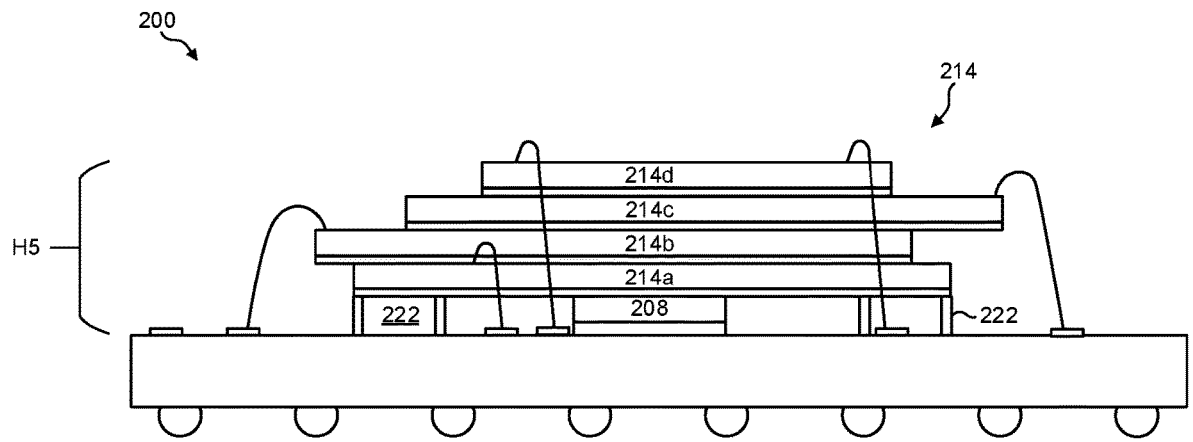
FIG. 7 is a cross-sectional side view of the assembly of FIG. 2A in accordance with embodiments of the present technology.
Figure 8:
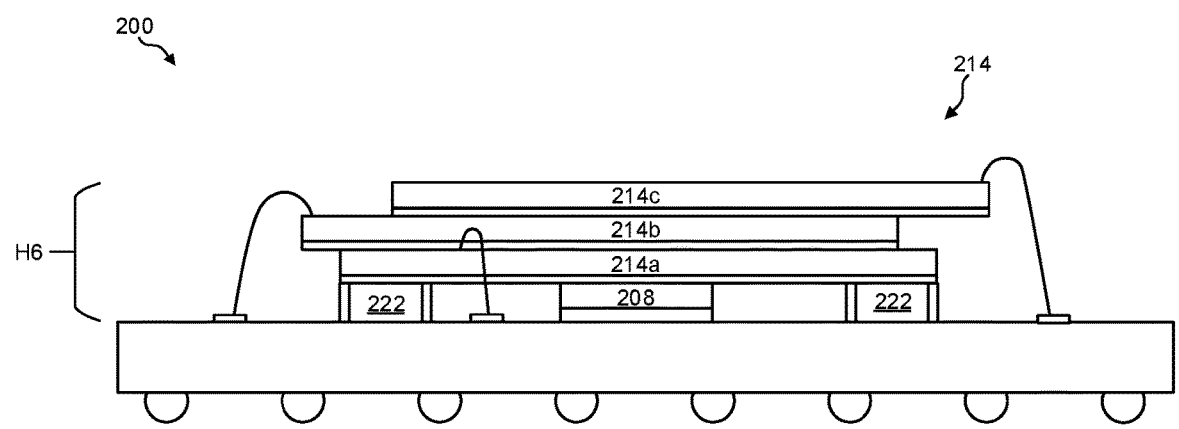
FIG. 8 is a cross-sectional side view of the assembly of FIG. 2A in accordance with embodiments of the present technology.

FIGS. 7 and 8 are cross-sectional side views of the assembly 200 of FIG. 2A in accordance with embodiments of the present technology. FIG. 7 shows the die stack 214 including four semiconductor dies 214a-d. As a result, the height H5 of the stack of second dies 214 and the first die 208 can be reduced as compared to the embodiment of the assembly 200 illustrated in FIG. 2. FIG. 8 shows the stack of second dies 214 three semiconductor dies 214a-c. As a result, the height H6 of the stack of second dies 214 and the first die 208 is further reduced compared to the embodiment of the assembly 200 illustrated in FIG. 7.

In some embodiments of the present technology, a plurality of assemblies 200 can be used in a single computing system. In some embodiments, the reduction in the overall footprint 232 of each assembly 200 can be used in conjunction with the height reductions illustrated in FIGS. 7 and 8 to select between packing additional semiconductor dies into a longitudinal area, reducing the size of the longitudinal area, and/or reducing the height of each assembly 200 in the longitudinal area. For example, because the overall footprint 232 is small more assemblies 200 can be packed into a longitudinal area. Accordingly, if the number of second semiconductor dies 214a-N in the stack does not change, more semiconductor dies are packed in the longitudinal area. Alternatively, in some embodiments, the height of each assembly can be relatively low as illustrated in FIGS. 7 and 8, while the total number of semiconductor dies in the longitudinal area does not change. In some embodiments, sufficient space can be gained through the reduction in the overall footprint 232 of each assembly 200 to allow the height of each assembly to be reduced while the total number of semiconductor dies increases. In these embodiments, the size of the electronic device can shrink while the capacity and/or speed of the resulting electronic device increases.

Figure 9:
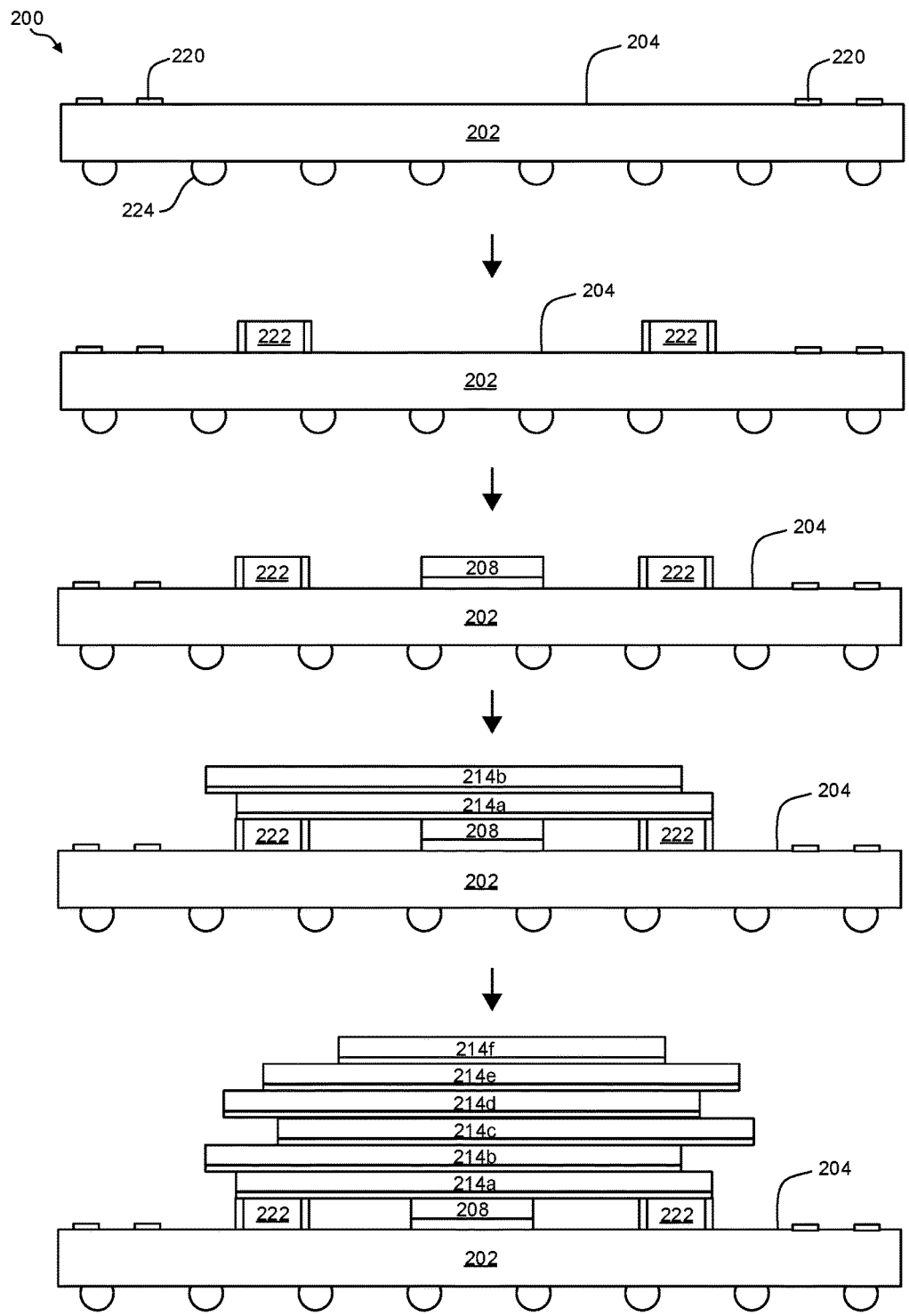
FIGS. 9A-9E are cross-sectional side views of the assembly of FIG. 2A at various stages of a method in accordance with embodiments of the present technology.

FIGS. 9A-9E illustrate the assembly 200 if FIG. 2A at various stages of a method of manufacturing in accordance with some embodiments of the present technology. FIG. 9A is a cross-sectional sideview of the assembly 200 of FIG. 2A before any of the semiconductor elements have been attached to the package substrate 202. In the illustrated embodiment, the bond sites 220 have been formed on the front side 204 of the package substrate 202 and the interconnect elements 224 have been attached to the back side 206 of the package substrate 202. In some embodiments, the interconnect elements 224 can be attached to the back side 206 at various other points in the method. For example, in some embodiments, the method can attach the interconnect elements 224 after the assembly 200 is otherwise complete.

FIG. 9B is a cross-sectional sideview of the assembly 200 of FIG. 2A after the capacitors 222 have been mounted (e.g., positioned, and/or placed, attached, etc.) on the front side 204 of the package substrate 202 in accordance with some embodiments of the present technology. In some embodiments, the capacitors 222 can be adhered to the front side 204 of the package substrate 202 by various attach films, epoxies, tapes, pastes, and/or other suitable materials. In some embodiments, the method includes encasing the capacitors 222 with an encapsulant material (for example as shown in FIG. 5). The method can also include planarizing an upper surface of the encapsulant material (e.g., through a planarization process). By covering the capacitors 222 before any other elements are added to the assembly 200, the method can reduce the potential of damaging the other elements from the planarization.

FIG. 9C is a cross-sectional sideview of the assembly 200 of FIG. 2A after the first die 208 has been mounted to the front side 204 of the package substrate 202 in accordance with some embodiments of the present technology. In some embodiments, the method includes covering the capacitors 222 and the first die 208 with an encapsulant material (for example as shown in FIG. 6) and optionally planarizing an upper surface of the encapsulant material. As disclosed above, by encapsulating both the capacitors 222 and the first die 208 and then planarizing an upper surface of the encapsulant material, the stability of the assembly 200 is expected to be enhanced.

The method can optionally include mounting spacers 212 to front side 204 of the package substrate 202, such as described above with respect to FIG. 4. The spacers are expected to support the die stack 214. In some embodiments, the spacers 212 are used when the variation in the height of the capacitors 222 is outside of a tolerance range for the assembly 200.

FIG. 9D is a cross-sectional sideview of the assembly 200 of FIG. 2A after two second semiconductor dies 214a, 214b have been attached to the capacitors 222 and the first die 208. The second semiconductor dies 214a, 214b can be attached using a die-attach film 216. In various other embodiments, the second semiconductor dies 214a, 214b can be attached using other adhesive films, epoxies, tapes, pastes, or other suitable materials.

In the illustrated embodiment, the lowermost second semiconductor die 214a has a footprint larger than the footprint of the first die 208. Accordingly, the lowermost second semiconductor die 214a can be positioned to be supported by the capacitors 222 and the first die 208 (e.g., the lowermost second die 114a is centered above the capacitors 222 and the first die 208). In some embodiments, the lowermost second semiconductor die 214a is positioned to distribute the overall weight of the die stack 214. The lowermost semiconductor die 214a can accordingly be positioned to generally distribute the weight of the lowermost semiconductor die 214a and/or the full die stack 214 evenly across the capacitors 22 and the first die 208.

As further illustrated by FIG. 9D, the next second semiconductor die 214b can be attached to the lowermost second semiconductor die 214a and positioned to leave at least a portion of an upper surface of the lowermost second semiconductor die 214a exposed for electrically connecting the lowermost second semiconductor die 214a to the package substrate 202 (e.g., using the connectors 218 illustrated in FIG. 2A). In some embodiments, the second semiconductor dies 214a, 214b can alternatively be stacked in direct alignment with each other and electrically connected using through-silicon vias (TSVs) and/or flip-chip bonding. Further, the second semiconductor dies 114a, 214b can be electrically connected to the first die 208 using through-silicon vias (TSVs), flip-chip bonding, and/or through a one or more wire bonds on an uppermost semiconductor die connected to the package substrate 202.

FIG. 9E is a cross-sectional sideview of the assembly 200 of FIG. 2A after four additional second semiconductor dies 214c-f have been stacked (e.g., mounted above) on top of the second semiconductor dies 214a, 214b. Each of the additional second semiconductor dies 214c-f can be attached using the die-attach film 216 and positioned to at least partially expose the upper surface of the immediately lower second semiconductor dies 214b-e to which they are attached. The additional second semiconductor dies 214c-f can alternatively be stacked in direct alignment with each other (e.g., with no overhang or exposed portions) and electrically connected using through-silicon vias (TSVs) and/or flip-chip bonding.

In some embodiments, the die stack 214 can be configured such that its weight is distributed evenly among the capacitors 222 and the first die 208. For example, in the illustrated embodiment, the lowermost second semiconductor die 214a and the uppermost second semiconductor die 214f are generally centered over the capacitors 222 and the first die 208, while the middle second semiconductor dies 214b-d are sequentially offset from each other by equal distances on both sides.

Figure 10:
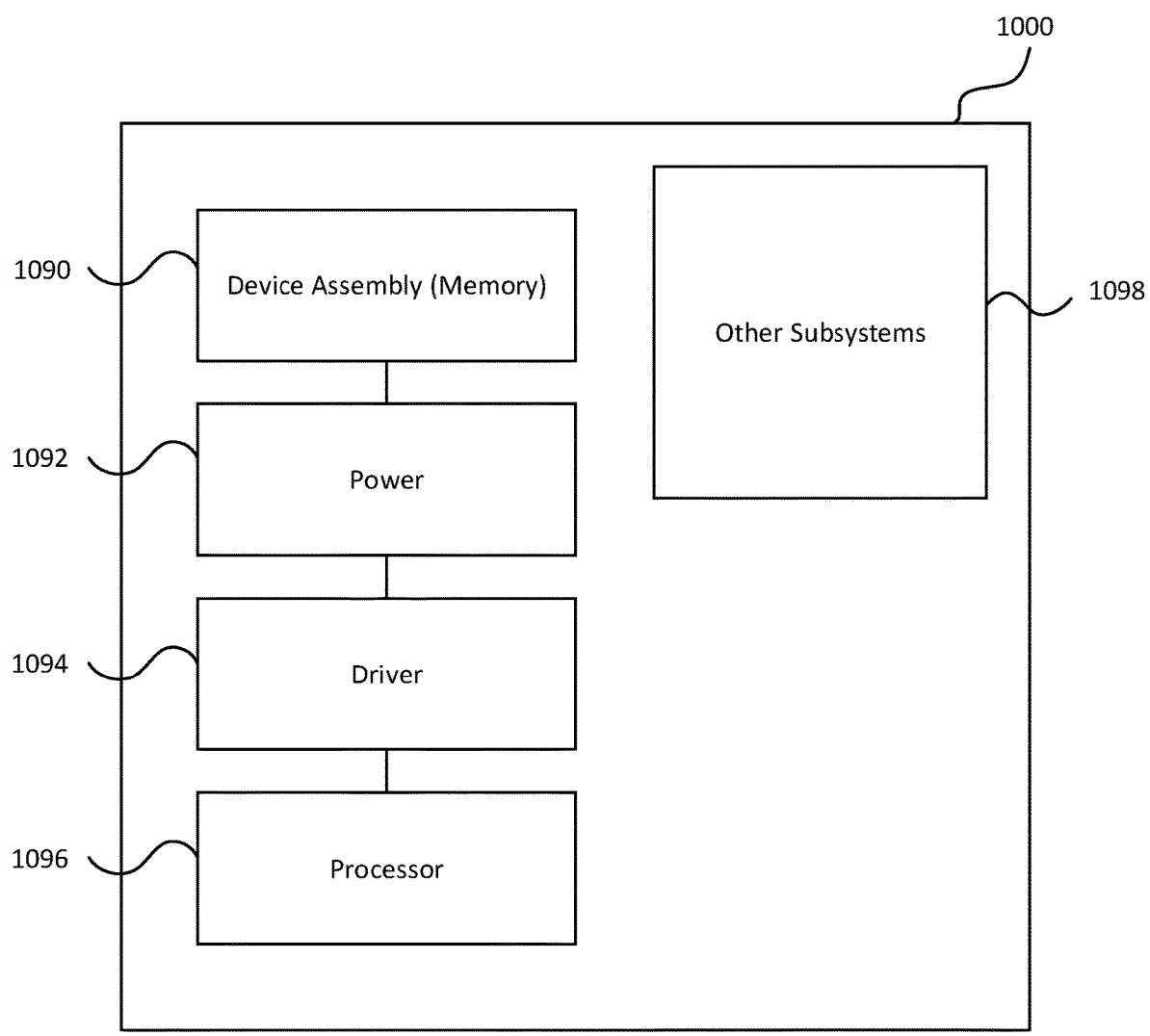
FIG. 10 is a schematic view of a system that includes a semiconductor die assembly configured in accordance with embodiments of the present technology.

Any one of the semiconductor devices having the features described above with reference to FIGS. 2A-8 can be incorporated into any of a myriad of larger and/or more complex systems, a representative example of which is system 1000 shown schematically in FIG. 10. The system 1000 can include a memory 1090 substantially as described above (e.g., SRAM, DRAM, flash, and/or other memory devices), a power supply 1092, a drive 1094, a processor 1096, and/or other subsystems or components 1098. The semiconductor devices described above with reference to FIGS. 2A-9 can be included in any of the elements shown in FIG. 10. For example, the memory 1090 can be a DDR5 DIMM. The resulting system 1000 can be configured to perform any of a wide variety of suitable computing, processing, storage, sensing, imaging, and/or other functions. Accordingly, representative examples of the system 1000 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional representative examples of the system 1000 include lights, cameras, vehicles, etc. With regard to these and other example, the system 1000 can be housed in a single unit or distributed over multiple interconnected units, e.g., through a communication network. The components of the system 1000 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Furthermore, certain aspects of the present technology described in the context of particular embodiments may also be combined or eliminated in other embodiments. For example, the various embodiments described with reference to FIGS. 2A-9 may be combined to incorporate different numbers of stacked semiconductor dies (e.g., three dies, five dies, six dies, eight dies, etc.) that are laterally offset in different manners. Accordingly, the invention is not limited except as by the appended claims. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device comprising:
   a package substrate having a front side and a backside opposite the front side;
   a controller die having a first surface connected to the front side of the package substrate, a second surface opposite the first surface, and a first longitudinal footprint;
   a stack of second semiconductor dies on the second surface of the controller die, wherein the stack of second semiconductor dies has a second longitudinal footprint greater than the first longitudinal footprint in at least one dimension;
   a passive electrical component on the front side of the package substrate and positioned at least partially within the second longitudinal footprint, wherein the passive electrical component has a first surface contacting the package substrate and a second surface opposite the first surface of the passive electrical component; and
   an encapsulant material encasing the passive electrical component, the encapsulant material having an upper surface in a longitudinal plane with the second surface of the controller die and covering the second surface of each passive electrical component such that the encapsulant material contacts a lower surface of the stack of second semiconductor dies,
   wherein the encapsulant material and the controller die support the stack of second semiconductor dies.

2. The semiconductor device of claim 1 wherein the passive electrical component comprises two or more capacitors positioned completely within the second longitudinal footprint.

3. The semiconductor device of claim 2 wherein the controller die has a first height, and wherein the two or more capacitors have a second height generally equal to the first height.

4. The semiconductor device of claim 1, wherein the passive electrical component comprises at least two capacitors in which at least a first capacitor is under the stack of second semiconductor dies and spaced laterally apart from a first edge of the controller die and at least a second capacitor is under the stack of second semiconductor dies and spaced laterally apart from a second edge of the controller die, and wherein the first and second capacitors are spacers that support the stack of second semiconductor dies.

5. The semiconductor device of claim 4 wherein the encapsulant material is a first encapsulant material, further comprising a second encapsulant material at least partially encasing the controller die, the first encapsulant material, and the stack of second semiconductor dies.

6. The semiconductor device of claim 1 wherein the controller die is also at least partially encased in the first encapsulant material.

7. The semiconductor device of claim 1 wherein the passive electrical component comprises more than two capacitors within the second longitudinal footprint under the stack of second semiconductor dies.

8. A semiconductor device comprising:
   a package substrate having a front side;
   a first semiconductor die on a central portion of the front side of the package substrate and having a first longitudinal footprint and an upper surface at a first height above the front side of the package substrate;
   a stack of second semiconductor dies on top of the first semiconductor die, wherein the stack of second semiconductor dies has a second longitudinal footprint larger than the first longitudinal footprint of the first semiconductor die; and
   a plurality of capacitors on the front side of the package substrate and at least partially underneath the stack of second semiconductor dies, wherein:
      each capacitor in the plurality of capacitors has a first surface contacting the front side of the package substrate and a second surface opposite the first surface of the capacitor, wherein the second surface is at a second height equal to the first height such that the second surface contacts a lower surface of the stack of second semiconductor dies to at least partially support the stack of second semiconductor dies, and
      each capacitor in the plurality of capacitors is at least partially encased in an encapsulant material, the encapsulant material having a top surface at a third height above the front side of the package substrate equal to the first height, wherein the top surface of the encapsulant material is in contact with a bottom second die of the stack of second semiconductor dies.

9. The semiconductor device of claim 8 wherein the plurality of capacitors are positioned to generally evenly distribute the weight of the stack of second semiconductor dies among each capacitor in the plurality of capacitors.

10. The semiconductor device of claim 8 wherein the plurality of capacitors comprises at least two capacitors in which at least a first capacitor is under the stack of second semiconductor dies and spaced laterally apart from a first edge of the first semiconductor die and at least a second capacitor is under the stack of second semiconductor dies and spaced laterally apart from a second edge of the first semiconductor die.

11. The semiconductor device of claim 8 wherein the plurality of capacitors are positioned completely within the second longitudinal footprint of the stack of second semiconductor dies.

12. The semiconductor device of claim 8, further comprising one or more silicon spacers disposed on the front side of the package substrate and within the second longitudinal footprint, wherein the one or more silicon spacers are positioned to at least partially support the stack of second semiconductor dies.

13. The semiconductor device of claim 12 wherein:
the first semiconductor die is positioned in a first region central to the front side;
the plurality of capacitors are positioned in a second region; and
the one or more silicon spacers are positioned in a third region, wherein the second region is positioned between the first region and the third region.

14. A semiconductor device comprising:
a package substrate having a front side;
a first semiconductor die on a central portion of the front side of the package substrate and having a first longitudinal footprint and an upper surface at a first height above the front side of the package substrate;
a stack of second semiconductor dies on top of the first semiconductor die, wherein the stack of second semiconductor dies has a second longitudinal footprint larger than the first longitudinal footprint of the first semiconductor die;
a plurality of capacitors on the front side of the package substrate and at least partially underneath the stack of second semiconductor dies, wherein the plurality of capacitors at least partially support the stack of second semiconductor dies; and
an encapsulant material at least partially encasing each capacitor in the plurality of capacitors, wherein the encapsulant material has a top surface at a second height above the front side of the package substrate equal to the first height, and wherein the top surface is in contact with a bottom second die of the stack of second semiconductor dies.

15. The semiconductor device of claim 14 where the plurality of capacitors comprises a first capacitor spaced laterally apart from a first edge of the first semiconductor die and a second capacitor spaced laterally apart from a second edge of the first semiconductor die opposite the first edge.

16. The semiconductor device of claim 14 wherein the plurality of capacitors are positioned to generally evenly distribute the weight of the stack of second semiconductor dies among each capacitor in the plurality of capacitors.

17. The semiconductor device of claim 14 wherein the plurality of capacitors are positioned completely within the second longitudinal footprint of the stack of second semiconductor dies.

18. The semiconductor device of claim 14 wherein the encapsulant material fully covers each of the plurality of capacitors.

* * * * *